(12) United States Patent
Boerner

(10) Patent No.: US 8,847,258 B2
(45) Date of Patent: Sep. 30, 2014

(54) ORGANIC ELECTROLUMINESCENT DEVICES

(75) Inventor: Herbert F. Boerner, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 46 days.

(21) Appl. No.: 13/509,890

(22) PCT Filed: Nov. 17, 2010

(86) PCT No.: PCT/IB2010/055217
§ 371 (c)(1),
(2), (4) Date: May 15, 2012

(87) PCT Pub. No.: WO2011/064693
PCT Pub. Date: Jun. 3, 2011

(65) Prior Publication Data
US 2012/0228600 A1 Sep. 13, 2012

(30) Foreign Application Priority Data
Nov. 27, 2009 (EP) .................................... 09177348

(51) Int. Cl.
| H01L 33/00 | (2010.01) |
| H01L 27/15 | (2006.01) |
| H01L 29/16 | (2006.01) |
| H01L 31/12 | (2006.01) |
| H01L 29/26 | (2006.01) |
| H01L 29/08 | (2006.01) |
| H01L 35/24 | (2006.01) |
| H01L 51/00 | (2006.01) |
| H01L 21/00 | (2006.01) |
| H01L 51/52 | (2006.01) |
| H01L 51/56 | (2006.01) |

(52) U.S. Cl.
CPC ............. *H01L 51/5237* (2013.01); *H01L 51/56* (2013.01); *H01L 2251/5361* (2013.01)

USPC ................. 257/98; 257/100; 257/82; 257/79; 257/40; 438/69

(58) Field of Classification Search
None
See application file for complete search history.

(56) References Cited

U.S. PATENT DOCUMENTS

| 6,121,727 A | 9/2000 | Kanai et al. |
| 6,812,637 B2 | 11/2004 | Cok et al. |
| 6,933,002 B2 * | 8/2005 | Tera et al. ........................ 427/66 |

(Continued)

FOREIGN PATENT DOCUMENTS

| CN | 101114701 A | 1/2008 |
| JP | 2006004770 | 1/2006 |
| WO | 2007099476 A1 | 9/2007 |

*Primary Examiner* — Steven Loke
*Assistant Examiner* — Juanita B Rhodes
(74) *Attorney, Agent, or Firm* — Yuliya Mathis

(57) ABSTRACT

The invention relates to an organic electroluminescent device (1) comprising a substrate (2), at least one electroluminescent layer stack on top of the substrate (2) with at least a substrate electrode (3), a counter electrode (5) and at least one organic electroluminescent layer (4) arranged between substrate electrode (2) and counter electrode (5), and a short prevention layer (6) covering the counter electrode (5) establishing a double layer (DL) with a tensile stress (TS) induced by the short prevention layer (5), and an electrically isolating layer (8) at least partly covering the short prevention layer (6), wherein the electrically isolating layer (8) is suitable to partially dissolve the organic layer (4) in the vicinity of a defect (7) within the electroluminescent layer stack and the tensile stress (TS) induced by the short prevention layer (6) is suitable to roll up (10) the double layer (DL) adjacent to the defect (7) after deposition of the electrically isolating layer (8). The invention further relates to a method to manufacture such OLED devices (1) and the use of a short prevention layer (6) to prevent shorts in such OLED devices (1).

14 Claims, 1 Drawing Sheet

(56) References Cited

U.S. PATENT DOCUMENTS

| | | | |
|---|---|---|---|
| 7,348,724 B2 * | 3/2008 | Lee | 313/504 |
| 2003/0140982 A1 | 7/2003 | Seki et al. | |
| 2004/0135503 A1 | 7/2004 | Handa et al. | |
| 2007/0241665 A1 * | 10/2007 | Sakanoue et al. | 313/503 |
| 2008/0264680 A1 | 10/2008 | Borner et al. | |
| 2009/0212685 A1 * | 8/2009 | Boerner | 313/503 |

* cited by examiner

ORGANIC ELECTROLUMINESCENT DEVICES

FIELD OF THE INVENTION

The invention relates to the field of organic electroluminescent devices (OLED devices) adapted to prevent shorts, a method to manufacture such OLEDs and the use of counter electrodes to prevent shorts in such OLED devices.

BACKGROUND OF THE INVENTION

Conventional organic electroluminescent (OLED) devices are usually produced by deposition of the electrodes and the required thin organic electroluminescent layer(s) on a transparent substrate such as glass or a polymer foil through which the light is emitted. When a voltage between around 2 and 10 Volts is applied between the two electrodes the electroluminescent layer or stack of layers emits light. In such OLED devices the electrode deposited onto the substrate—usually referred to as substrate electrode and also usually forming the anode—can be deposited as thin layer of an electrically conducting but optically transparent oxide, typically indium-tin oxide (ITO). The electrode opposing the substrate electrode—usually referred to as counter electrode and also usually forming the cathode—is generally formed by evaporation of a layer of aluminum or silver with a thickness of around 100 nm after deposition of the electroluminescent layer(s).

The major advantage of OLED devices is the possibility of being able to produce thin light sources covering large areas. It is precisely in the case of large-area OLED layers covering a few square centimeters or more that the presence of particles, of dust for example, is unavoidable during the production process. Particles present on the substrate, such for example as dust particles of a diameter substantially greater than the thickness of the electroluminescent layer stack, cause defects, e.g. holes in the adjacent electroluminescent layer stack with edges of an undefined nature. No layered structure, or only a part of it, is present inside such hole. These defects result in unacceptable leakage currents and short-circuits between the substrate electrode and counter electrode. The short-circuits generally do not occur in this case until, in the course of operation of the OLED device, the operating voltage has to be increased, due to the decline in light yield, to allow the same amount of light to be generated. In contrast to a slow degradation of brightness due to the infiltration of oxygen or water into the light-emitting layers, failures of OLED devices as a result of short-circuits in the region of a defect become apparent as a sudden drop in brightness to zero. It is precisely in the case of large-area OLED devices that short-circuits in the region of hole defects are by far the most common cause of failing OLED devices.

Document WO2007/099476 discloses an electroluminescent arrangement, where an electrically isolating layer is deposited on top of the aluminum cathode as the counter electrode in order to react with the organic layers of the electroluminescent layer stack underneath the aluminum cathode, where the aluminum layer has a hole defect. The material of the isolating layer dissolves the organic layers underneath the aluminum cathode in a confined region around the hole defect. As a result, the distance between substrate electrode (anode) and aluminum cathode increases and thus the electrical field strength between anode and cathode decreases. A reduced electrical field strength around a defect in the electroluminescent layer stack lowers the risk of short-circuits caused by such hole defects. However, the remaining aluminum cathode layer around a hole defect still extend over the edges of the remaining organic layers around the hole defect and still has sharp edges of undefined nature. If the electrically isolating layer does not fill the cavity underneath the aluminum cathode completely and subsequently isolate cathode from anode perfectly, there is still a risk of short-circuits.

SUMMARY OF THE INVENTION

It is an object of the invention to provide an organic electroluminescent device electrode adapted to prevent short-circuits more effectively. A further object of the invention is the provision of a method for the production of such an organic electroluminescent device.

This object is achieved by an organic electroluminescent device comprising a substrate, at least one electroluminescent layer stack on top of the substrate with at least a substrate electrode, a counter electrode and at least one organic electroluminescent layer arranged between substrate electrode and counter electrode, and a short prevention layer covering the counter electrode establishing a double layer with a tensile stress induced by the short prevention layer, and an electrically isolating layer at least partly covering the short prevention layer, wherein the electrically isolating layer is suitable to partially dissolve the organic layer in the vicinity of a defect within the electroluminescent layer stack and the tensile stress induced by the short prevention layer is suitable to roll up the double layer adjacent to the defect after deposition of the isolating layer.

A counter electrode having tensile stress will increase the distance between the edges of a counter electrode and the substrate electrode around a defect in the electroluminescent layer (also denoted as layer defect), for example a hole defect caused by a dust particle present on top of the substrate electrode preventing material deposited in the neighborhood of the dust particle due to shadowing effect during layer deposition. However, a somehow upwards curved shape of the counter electrode adjacent to such a layer defect increasing the required field strength to initiate a short between counter and substrate electrode is suitable to lower the risk of shorts. To fully avoid the risk of shorts, the edges of the counter electrode have to be removed from the vicinity of a defect. A short prevention layer prepared on top of the counter electrode induces tensile stress to the layer system of counter electrode and short prevention layer. This enables the adjustment of the tensile stress of the double layer of counter electrode and the short prevention layer adhering to the counter electrode to be suitable to roll-up the double layer around a layer defect as a result of a weakened adhesion of the counter electrode on the organic electroluminescent layer stack around the layer defect. Here the term "roll-up" denotes the rolling-in or curling of the double layer analogue to a paper on a paper role. The roll-up of the double layer prevents shorts between counter electrode and substrate electrode due to the absence of the counter electrode adjacent to the defect. A flat counter electrode is still present as desired on non-disturbed organic electroluminescent layer(s). The term "double layer" shall denote a layer stack, where two essential components (counter electrode and short prevention layer) are present. The term "double layer" explicitly includes the possibility of additional layers between counter electrode and short prevention layer. Here the counter electrode shall be understood in a functional component to apply a voltage to the organic electroluminescent device. The counter electrode may be a layer or a layer stack of one or more layers required to establish a certain electrical conductivity to be able to act as an electrode.

The short prevention layer shall be understood in a functional component to induce a certain tensile stress to the counter electrode, where the short prevention layer adheres to. The short prevention layer may be a layer or a layer stack of one or more layers required to induce a certain tensile stress.

The short prevention layer is deposited by vacuum evaporation inducing a tensile stress in the double layer of counter electrode and short prevention layer. The tensile stress is present at room temperature after deposition achieving the desired roll-up behavior of the double layer in the vicinity of the defect without any further heat treatment. The roll-up behavior will prevent short before starting up the operation of the OLED device for the first time, denoted as initial start-up. Therefore shorts are prevented before operating the organic electroluminescent devices for the first time avoiding any leakage currents with layer defects subsequently avoiding any aging effects caused by these leakage currents.

Commonly stress in layers manifests itself most obviously in the bending of a very thin substrate on which it is deposited. A number of different methods has been used to measure the bending of such thin substrate as an indication the present stress of the deposited layer. The most general arrangement is to use a thin strip of glass, clamped at one end to form a cantilever, onto which the film is deposited. The deflection of the free end, as the strip becomes bent, is then measured e.g by direct optical observation of the free end with a microscope, measurement of the electrical capacity formed between the flexible strip and a fixed conducting plate held parallel and close to it or by electromeachanical measurements of the deflection using a stylus pick-up touching the free end. As an example, evaporated aluminum layer (e.g. as counter electrodes) exhibit a high tensile stress at layer thicknesses below 10 nm. Al layers with such thin layer thickness do not have a sufficient electrical conductivity to be applied as electrodes. Al electrodes of commonly 20 nm thickness or more exhibit nearly no stress or a weak comprehensive stress. The required tensile stress suitable to roll-up the counter electrode has to be induced by an additional layer prepared on top of the counter electrode and sufficiently adhering to the counter electrode.

In an embodiment the short prevention layer is made of at least one material of the group of manganese, copper, magnesium fluoride or silver, or alloys comprising these materials or combinations thereof having a suitable tensile stress to show the desired roll-up behaviour after being deposited on top of the organic electroluminescent layer(s) by vacuum evaporation.

The organic electroluminescent device (OLED device) can be any OLED device known to the skilled person. In further embodiments the OLED device of the present invention is used as or comprised by a light source, a lamp, or is comprised by a monitor, switch or display. Thus, also a light source, a lamp, a monitor, a switch and a display comprising the inventive EL device are encompassed by the present invention. In the following the basic structure of an OLED device is described exemplarily.

The substrate preferably is transparent and can comprise any suitable material known to the skilled person. In the present invention the term "transparent" refers to the transmission of in the visible range of ≥50% light in the given material, e.g. the substrate or the electrode. The remaining light is thus either reflected and/or absorbed. "Transparent" includes "semi-transparent" referring to a material that exhibits a transmission of light in the visible range of between ≥10% and <50%. Thus, whenever reference is made to a "transparent" material this also explicitly discloses a "semi-transparent" material if not stated otherwise. Preferably light in the visible range has a wavelength of between ≥450 nm and ≤700 nm. Thus, for example, a transparent substrate or electrode absorbs and/or reflects less than 50% of the incident light.

In preferred embodiments of the invention the substrate is made from glass, plastics, or ceramics. Further preferred materials for the substrate comprise polymer sheets or foils, more preferably with a suitable moisture and oxygen barrier to essentially prevent moisture and/or oxygen entering the OLED device. The substrate may further comprise additional layers, e.g. for optical purposes such as light out-coupling enhancement and the like.

The substrate can have any suitable geometry, shape or form but is preferably flat and may, if a flexible material is utilized, be shaped or bent into any three-dimensional shape that is required.

The substrate electrode can be made from any suitable material known to the skilled person. In a preferred embodiment the substrate electrode is a transparent electrode. In a further preferred embodiment of the invention the substrate electrode comprises a transparent conducting oxide (TCO), more preferably indium-tin oxide (ITO), ZnO, or doped ZnO. Optionally the substrate electrode is undercoated with $SiO_2$ and/or SiO to advantageously suppress diffusion of mobile atoms or ions from the substrate into the electrode. Electrodes comprising a TCO preferably have a transparency of ≥60% and ≤100%, more preferably of ≥70% and ≤90% and most preferably of about 80%.

In the context of the invention the notion counter electrode denotes an electrode away from the substrate. It is usually non-transparent and made of Al or Ag layers of sufficient thickness such that the electrode is reflecting (typically 100 nm for Al and 100-200 nm for Ag). It is usually the cathode, but it can also be biased as the anode. For top-emitting or transparent electroluminescent devices the counter electrode has to be transparent. Transparent counter electrodes are made of thin Ag or Al layers (5-15 nm) or of ITO layers deposited on top of the other previously deposited layers. In a preferred embodiment, the thickness of the counter electrode is below 140 nm, preferably between 10 and 100, more preferably between 20 and 80 nm, even more preferred between 30 and 50 nm in order to be able to be rolled-up by the short prevention layer.

The electrodes (counter and substrate) can be connected to a voltage/current source via electrical conductors.

The electroluminescent layer stack may comprise one organic electroluminescent layer or multiple organic electroluminescent layers denoted as organic electroluminescent layer stack. However, various other basic structures of OLED devices are known to the skilled person, all of which are meant to be encompassed by the present invention. In the context of the invention the notion electroluminescent layer stack denotes also all layers prepared between the substrate electrode and the counter electrode. In one embodiment of an EL layer stack, it comprises at least one light emitting organic electroluminescent layer prepared between substrate and counter electrode. In other embodiments the layer stacks may comprise several layers prepared between substrate and counter electrode. The several layers may be organic layers, such as one or more hole transport layers, electron blocking layers, electron transport layers, hole blocking layers, emitter layers or a combination of organic and non-organic layers. The non-organic layers may be additional electrodes in case of two or more light emitting layers within the layer stack and/or charge injection layers. The organic electroluminescent layer or organic electroluminescent layer stack in case of more than one organic layer can be any layer or stack known to the skilled person and/or suitable for an OLED device. As described above an electroluminescent layer stack comprises at least one EL emitter layer comprising EL molecules. A single EL emitter layer preferably has a thickness of about 10 nm.

Preferred organic electroluminescent layer stacks comprise more than one light-emitting layer, each comprising at least one type of electroluminescent molecule. Preferably, the light-emitting layers emit light of different colors. This is especially advantageous if color tunable OLED devices are required. In a further embodiment of the invention the organic electroluminescent layer stack comprises at least two light-emitting layers having different emission colors. This means that if the OLED device of the present invention is induced to emit light by application of electric voltage/current each of the at least two emission layers will emit light at a different wavelength. Different emission colors are usually achieved by use of different EL molecules that are comprised by the EL emission layers. Each EL emission layer can comprise a single or, more than one type of EL molecules. In more preferred embodiments, the EL stack comprises three EL emission layers emitting red, green and blue light, respectively.

An exemplary basic OLED device comprises a substrate electrode as an anode usually disposed on a substrate such as glass or flexible polyethylene terephtalate (PET) foil. On top of the transparent substrate electrode, the organic layer(s) are disposed comprising at least one emitter layer comprising at least one type of electroluminescent (EL) molecules. The counter electrode, usually the cathode, is disposed on top of said organic layer stack. The skilled person will be aware of the fact that various other layers may be incorporated for the production of such an OLED device, for example, a hole transport layer that may contact the anode, an electron transport layer that may contact the cathode, a hole injection layer—preferably made from poly(3,4-ethylendioxythiophene)/polystyrolsulfonate (PEDOT/PSS)—disposed between the anode and the hole transport layer and/or a electron injection layer—preferably a very thin layer made from lithium fluoride, or cesium fluoride—disposed between the electron transport layer and the cathode. Furthermore, it is known to the skilled person that OLED devices may comprise an organic layer stack wherein more than one emitter layer is present.

In one embodiment the organic light emitting layer(s) comprise organic light-emitting molecules such as polymers (PLEDs) or small molecules (SMOLEDs) to emit light. In another preferred embodiment, the OLED device is a phosphorescent organic light-emitting diode (PHOLED) device. The present invention is not restricted to specific organic molecules provided such are suitable for the use as electroluminescent molecules in OLED devices. Various organic light-emitting molecules are known to the skilled person, all of which are meant to be encompassed by the present invention. As used in the present invention "light-emitting molecules" preferably mean "organic electroluminescent molecules". In preferred embodiments the polymers of a PLED are conjugated polymers such as derivates of poly(p-phenylen-vinyls) (PPV) and the small molecules of an SMOLED are organometallic chelates, such as for example Alq3, and/or conjugated dendrimers.

The electroluminescent device according to the invention comprises an encapsulation means to encapsulate the electroluminescent layer stack. The encapsulation means may also encapsulate the whole stack of layers of the electroluminescent device or just a plurality of layers, forming a part of the whole stack of layers. Preferably, the encapsulation means is a gas-tight element, covering at least the organic electroluminescent layer and the counter electrode. By using a gas-tight encapsulation means, it is prevented that environmental factors like water, or oxygen can damage the encapsulated layers. The encapsulation means may form a gas-tight lid. This lid may be formed of glass or metal. It is also possible to form the encapsulation means by one or a plurality of layers applied to the electroluminescent device or just parts of it. The layers may comprise silicon, silicon oxide, silicon nitride, aluminum oxide or silicon oxinitride. All the named encapsulation means prevent mechanical and/or environmental factors from affecting the layer stack of the electroluminescent device adversely. As an example, the encapsulation means can be made of metals, glass, ceramics or combinations of these. It is attached to the substrate by conductive or non-conductive glue, melted glass frit or metal solder. Therefore, it may also provide mechanical stability for the electroluminescent device.

In another embodiment the short prevention layer has a layer thickness adapted to provide the suitable stress to roll up the counter electrode adjacent to the defect after deposition of the isolating layer, preferably a layer thickness of more than 20 nm, more preferred more than 40 nm, even more preferred more than 60 nm. The thicknesses shall not exceed a thickness, where the tensile stress initiates a roll-up of the double layer at non-disturbed areas (areas, where no layer defect is present). The thickness is one parameter enabling the adjustment of the tensile stress to the desire value, where the double layer adheres to the organic layers underneath, when no layer defect is present and where the double layer shows the roll-up behavior in the vicinity of layer defects, where the adhesion to the organic layers underneath is weakened by the isolation layer. People skilled in the art are able to adjust the layer thickness of the applied short prevention layer to the required thickness depending on the layer stack (materials and/or layer thicknesses and/or preparation conditions) underneath the short prevention layer within the scope of this invention.

The electrically isolating layer is deposited on top of the short prevention layer at least partly covering the short prevention layer. The material of the electrically isolating layer has an electrical resistance that is at least as high as the electrical resistance of the organic layer stack between counter and substrate electrode, so that no leakage currents between the electrodes will flow through the insulating layer. The thickness of the at least partially deposited isolating layer should be larger than the electroluminescent layer stack in order to be able to fill the entire region of the defect regardless of any dust particles that may still be clinging to the layers, e.g. at least 1 micrometer, preferably at least 1.5 micrometer, more preferred at least 2 micrometer, even more preferred more than 5 micrometer. A larger layer thickness (e.g. more than 10 micrometer) also improves the robustness of the electroluminescent layer stack against mechanical contact, e.g. with a cover lid encapsulating the OLED device in order to protect the OLED device against environmental gases to provide OLED device with lifetimes of more than 10000 h. A significant reduction of the emitted light of the organic electroluminescent devices of about a factor of 2 or more shall be understood as end of life.

In a preferred embodiment the electrically isolating layer is a polymer layer, preferably polymer layer comprising solvents or reactive components. Such polymer layers weaken the adhesion of the counter electrode to the uppermost organic layer of the organic electroluminescent layer stack by locally destroying the organic layers. After application, these polymers have to be hardened or cured, which can be achieved by evaporation of the solvents or by reaction of the components. The hardening process may be initiated or accelerated by heat or by application of UV light.

The invention further relates to method to manufacture an organic electroluminescent device according to the present invention, comprising the step of depositing a short prevention layer on top of the counter electrode having a tensile stress suitable to roll up a double layer of counter electrode and short prevention layer adjacent to a defect within the electroluminescent layer stack, and depositing the electrically isolating layer on top of the short prevention layer at least partly covering the short prevention layer, dissolving the at least one organic electroluminescent layer arranged between substrate electrode and counter electrode in a vicinity of the defect by the previously deposited electrically isolating layer, rolling-up of the double layer of counter electrode and short prevention layer adjacent to the defect induced by the present tensile stress within the double layer, and hardening or curing of the electrically isolating layer. The last step of hardening may further prevent any damage of the electroluminescent layer stack by the electrically isolating as a hard cover layer.

The deposition of the layers of the electroluminescent layer stack can be carried out by any suitable means. A group of preferred deposition techniques widely known to the skilled person are the vapor deposition techniques. Such techniques comprise chemical vapor deposition (CVD), such as low pressure CVD (LPCVD) or physical vapor deposition (PVD), such as sputtering or electron-beam evaporation. In a preferred embodiment, the short prevention layer is deposited by vacuum evaporation, which provides layers with easily reproducible stress conditions, when deposited on top of a substrate previously covered with other layers. The short prevention layer typically is deposited on a substrate kept at room temperature, using directly or indirectly heated crucibles. The deposition rates for copper and manganese range between 0.1 and 1 nm per second. The electrically isolating layer is deposited at room temperature under environmental conditions, e.g. ambient pressure. The deposition may be performed in dry atmosphere, preferably dry nitrogen atmosphere. The possibility to apply the isolating layer after depositing the complete electroluminescent layer stack lowers the process costs, also the application of the isolating layer in form of a liquid is possible. The electrically isolating layer preferably fully covers the counter electrode and the short prevention layer. In a preferred embodiment the electrically isolating layer is deposited by spray coating or by printing, preferably by screen or tampon printing. The advantage of spray coating is to apply a fast, simple and cheap technology. Also the deposition rate is high enabling to deposit a layer with thicknesses in the micrometer range. The material of the electrically isolating layer may be a polymer, preferably a polymer comprising solvents or reactive components (e.g. a two-component mixture) suitable for thermal and/or ultra violet curing in order to solidify the isolating layer. A two-component mixture comprises in this case a hardener and a binder. The advantage lies in the fact that the isolating layer solidifies by itself without a further process step. Such polymers weaken the adhesion of the counter electrode to the uppermost organic layer of the organic electroluminescent layer stack by dissolving locally the organic layers.

In another embodiment the method further comprises the step of curing the electrically isolating layer after deposition, preferably via exposure of the deposited electrically isolating layer to ultra violet light and/or enhanced temperature. The curing step solidifies the electrically isolating layer on top of the electroluminescent layer stack. A thermal curing leads to an evaporation of the solvent or a reaction of the components of the layer.

The invention further relates to the use of a short prevention layer, preferably made of copper or manganese, in organic electroluminescent devices according to the present invention having a tensile stress suitable to roll-up a double layer of counter electrode and short prevention layer around a layer defect after partial dissolving the at least one organic electroluminescent layer arranged between substrate electrode and counter electrode in a vicinity of the defect to prevent shorts between the counter electrode and a substrate electrode before initial start-up of the organic electroluminescent devices. The use of the short prevention layer to prevent shorts is easily applicable to any kind of OLED devices and advantageous compared to alternative solutions Also shorts are prevented before operating the organic electroluminescent devices avoiding any leakage currents with layer defects subsequently avoiding any aging effects caused by these leakage currents.

Preferred embodiments of the method according to the invention will be readily apparent to the skilled person when reading the description regarding the OLED device above. However, in the following some of the preferred embodiments will explicitly be disclosed.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
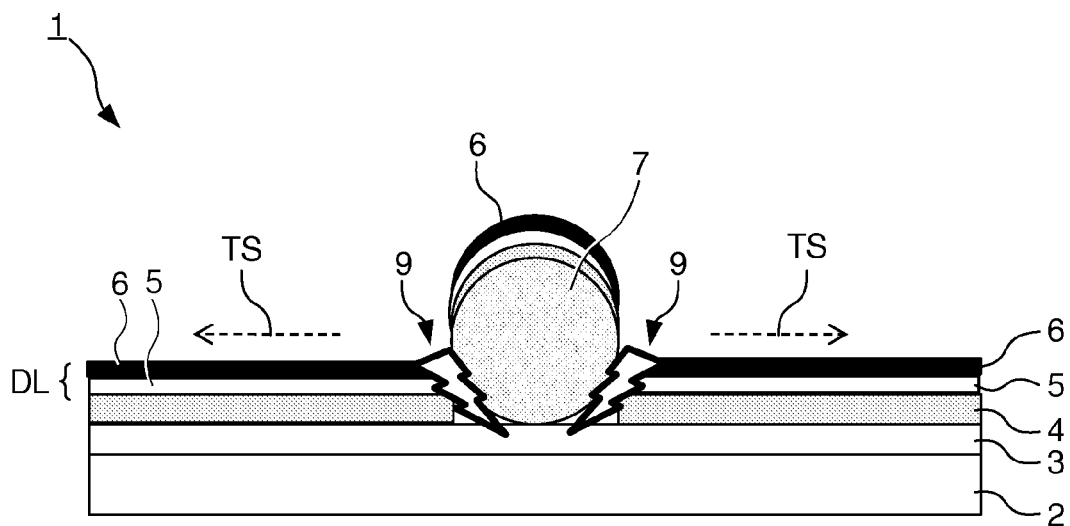
FIG. 1 schematic cross-sectional view of an OLED device according to the present invention before deposing the electrical isolating layer, FIG. 2 schematic cross-sectional view of an OLED device according to the present invention comprising the electrical isolating layer and rolled-up double layer in the vicinity of a defect.

FIG. 1 is a schematic cross-sectional view of an OLED device 1 according to the present invention comprising a flat glass substrate 2 onto which a transparent ITO anode of a layer thickness of 120 nm as the substrate electrode 3 has been deposited by sputtering or CVD. On top of the substrate electrode 3 an organic electroluminescent layer stack 4 to emit light is deposited comprising a 25 nm thick hole injection layer of NHT-5 α-NPD doped with 4% F4-TCNQ, a 10 nm thick hole transport layer of α-NPD, a 30 nm thick organic light emitting layer of a matrix material with embedded light emitting small molecules, and a 50 nm thick electron transporting layer of TPBI. People skilled in the art may chose alternative electroluminescent layer stack with additional layers or with a lower number of layer or even with a single organic light emitting layer within the present invention. A counter electrode 5 made of aluminum with a thickness of 100 nm is evaporated on top of the organic electroluminescent layer stack 4. On top of the counter electrode 5 a short prevention layer 6 made of copper is prepared with a layer thickness of 100 nm. The short prevention layer 6 and the counter electrode 5 form an adhering double layer DL with a tensile stress TS induced by the preparation conditions of the short prevention layer 6 of copper, here vacuum evaporation, and the selected layer thickness, here 100 nm. The tensile stress TS is indicated by the dashed arrow facing away from the defect 7. The tensile stress would roll-up the double layer DL in case of weak adhesion of the counter electrode 5 to the layers underneath, here the organic electroluminescent layer stack 4. To avoid a roll-up of the double layer DL at areas not disturbed by any defects 7, the tensile stress of the short prevention layer 6 is adjusted to be not sufficient to roll-up the double layer DL after deposition of the short prevention layer 6 on top of the counter electrode 5.

The layer structure shown in FIG. 1 is disturbed by a layer defect 7, e.g. a dust particle adhering to substrate electrode 3. Such dust particle 7 might have a diameter of a few microns. According to the state of the art, the preferred deposition technology for the organic layers and the counter electrode is vacuum evaporation. Vacuum evaporation is a deposition technology, where the materials to be deposited follow a straight path from the evaporation source to the substrate, leading to a directed deposition. A dust particle 7 present on top of the substrate electrode 3 has steep edges or overhanging edges, therefore these edges will prevent the material deposition underneath and in the direct vincinity of the dust particle 7. This effect is known as shadowing effect, which leads to holes in the organic layers 4 and the counter electrode 5. As shown in FIG. 1, the dust particle is covered on its top by the layers deposited after the dust particle adhered to the substrate electrode 3.

Without any additional layers such as electrical isolation layers on top of the short prevention layer 6, the risk of shorts 9 occurs at the edges of the layers around the defect 7. Between the cathode layer 5 and the substrate electrode layer 3, 2-10 V are applied during operation of the organic electroluminescent device. Such voltages lead to an electrical field in the organic layers of 20-100 kV/mm depending on the thickness of the electroluminescent layer stack and the applied voltage. The organic layers can be considered as a semiconductor with a very high resistivity. There is a critical area around the dust particle 7 since the organic layers 4 and the counter electrode 5 have a hole; therefore the surface of the conducting substrate electrode 3 is exposed to the environmental gas around the layers and the defect, which has a much lower dielectric constant than the organic layers resulting in a breakdown field much lower than for the organic layers causing a short 9 between the counter electrode 5 and the substrate electrode 3 during operation. Such short 9 will destroy the OLED.

Without any additional measures, the small radius of curcature of the cathode layer at the edge of a hole defect dramatically concentrates the electrical field at the edge of the layers leading to a short 9.

Figure 2:
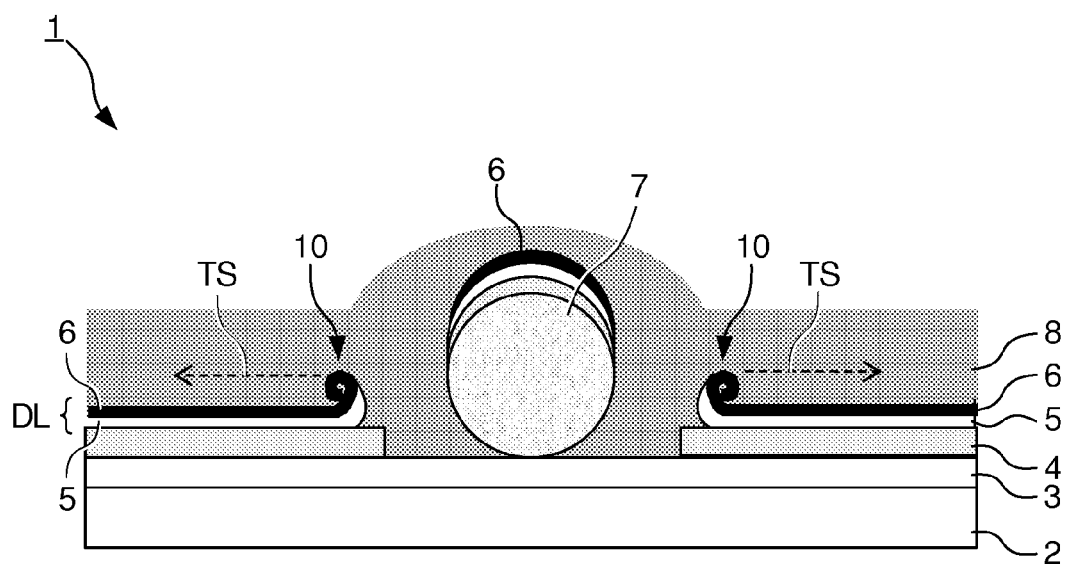

FIG. 2 shows an electroluminescent device according to the present invention, where the short prevention layer 6 and the counter electrode 5 are covered with an electrically isolating layer 8 deposited on top of the double layer DL of short prevention layer 6 and counter electrode 5. Since the viscosity of the electrically isolation layer 8 is low when deposited on top of the layer stack, the electrically isolating layer 8 is able to cover also the area around and underneath the defect 7 preventing a current flowing from rolled-up counter electrode 5 to substrate electrode 3 at the edges of the hole within the layer structure. The electrically isolating layer 8 dissolves parts of the organic electroluminescent layer stack 4 and thus weakens the adhesion of the counter electrode 5 to the organic layers 4 underneath the counter electrode 6. For the areas with weakend adhesion of the counter electrode 5 to the organic layers 4 underneath the counter electrode 5 the tensile stress TS (dashed arrow) induced by the short prevention layer 6 is sufficient to roll-up 10 the double layer DL of counter electrode 5 and short prevention layer 6.

The roll-up 10 is the required shaping of the counter electrode edges to avoid shorts 9 between counter electrode 5 and substrate electrode 3. The shape (similar to a so-called Rogowski-profile) guarantees that the electric field at the counter electrode edge is never larger than the average field in the undisturbed organic electroluminescent layer stack 4. Thus, a complete avoidance of the field-strength enhancement is possible. The shaping (roll-up) of the counter electrode as shown in FIG. 2 fully avoids the occurrence of short 9 at the edges of a layer defect (pinhole) 7, e.g. caused by dust particles:

Firstly, the counter electrode 5 is build of e.g. Aluminum or Silver in direct contact to organic layers 4, Secondly, a layer of a harder metal, which has a build-in stress stronger than the soft Aluminum is deposited on top of the counter electrode 5 as the short prevention layer 6. Copper was preferably used in the tests, but other metals like Manganese are also suitable. Also non-metallic layers with a high tensile stress like e.g. MgF can be used. Care has to be taken to adjust the thickness of this layer such that the tensile stress does not exceed the adhesion of the counter electrode to the organic layers, since this would lead to a complete de-lamination of the counter electrode. As an example, such effect may occur for Manganese layers of more than 50 nm thickness, Thirdly, the present layer structure is coated with a polymer solution, e.g. an isolating lacquer or spray in the simplest case, as the electrically isolating layer 8.

The solvents or reactive materials in the coating dissolve the organic layers through all the layer defects 7 (pinholes) and around the edges of the metal counter electrode 5. Where the metal counter electrode layer 5 is intact, the attack (dissolving of layers) is prevented. The interaction of the solvents with the organic layers 4 detaches the counter electrode metal 5 locally at each of the pinholes 7. Then, the induced stress— due to the short prevention layer 6—cause the rolling-up 10 of the double layer DL of counter electrode and short prevention layer away from the substrate electrode 3 reducing the electric field strength around the defect 7 (pinhole).

The new geometry of a rolled-up double layer DL reduces the electrical field around a layer defect 7 significantly. The free space created between the detached rolled-up double layer DL is filled with the electrically isolating layer 8 isolating the two electrodes reliably.

As an example the electrically isolating layer 8 is made of an isolating lacquer spray (URETHAN 71 spray from Farnell) with a layer thickness of 2 micrometer. The coating cured thermally, by heating the OLED to 60° C. for 30 min and the drying in vaccum for 1 h. Because the counter electrode 5 is detached at the pinholes, black spots (non-emitting areas) are formed. After drying of the lacquer layer, the device was normally operated, and no breakthrough could be initiated.

The previously described embodiments comprise an organic electroluminescent layer stack 4. All previously described processes are also valid, if the electroluminesent layer stack contains only one organic light emitting layer 4.

LIST OF REFERENCE SIGNS 1 organic electroluminescent device (OLED)
2 substrate
3 substrate electrode
4 organic electroluminescent layer (or layer stack)
5 counter electrode
6 short prevention layer
7 defect, here dust particle 8 electrically isolating layer
9 electrical short at the edge of layers around a defect
10 rolled-up double layer in the vicinity of a defect
DL double layer
TS tensile stress

The invention claimed is:

1. An organic electroluminescent device comprising a substrate, at least one electroluminescent layer stack on top of the substrate with at least a substrate electrode, a counter electrode and at least one organic electroluminescent layer arranged between the substrate electrode and the counter electrode, and a short prevention layer covering the counter electrode establishing a double layer (DL), wherein the short prevention layer has a thickness that provides a tensile stress (TS) in the double layer, and an electrically isolating layer at least partly covering the short prevention layer, wherein the electrically isolating layer is suitable to partially dissolve the organic layer in the vicinity of a defect within the electroluminescent layer stack and the tensile stress (TS) provided by the short prevention layer is suitable to roll up the double layer (DL) adjacent to the defect after deposition of the electrically isolating layer.

2. The organic electroluminescent device according to claim 1, wherein the short prevention layer comprises at least one material selected from the group consisting of manganese, copper, magnesium fluoride, silver, and combinations thereof.

3. The organic electroluminescent device according to claim 1, wherein the thickness of the short prevention layer is adapted to provide the tensile stress (TS) such that the tensile stress (TS) is suitable to roll up the counter electrode adjacent to the defect after deposition of the isolating layer.

4. The organic electroluminescent device according to claim 1, wherein the thickness of the counter electrode is below 140 nm.

5. The organic electroluminescent device according to claim 1, wherein the electrically isolating layer has a layer thickness of at least 1 micrometer.

6. The organic electroluminescent device according to claim 1, wherein the electrically isolating layer is a polymer layer comprising solvents or reactive components.

7. A method for manufacturing an organic electroluminescent device, comprising:

depositing a short prevention layer on top of a counter electrode, said short prevention layer having a tensile stress (TS) suitable to roll up a double layer (DL) of the counter electrode and the short prevention layer adjacent to a defect within an electroluminescent layer stack of the device, depositing an electrically isolating layer on top of the short prevention layer that at least partly covers the short prevention layer, dissolving at least one organic electroluminescent layer of the stack arranged between a substrate electrode and the counter electrode in a vicinity of the defect by the previously deposited electrically isolating layer, rolling-up the double layer (DL) of the counter electrode and the short prevention layer adjacent to the defect, wherein said rolling-up is induced by the tensile stress present within the double layer (DL), and hardening or curing the electrically isolating layer.

8. The method according to claim 7, wherein the short prevention layer is deposited by vacuum evaporation.

9. The method according to claim 7, wherein the electrically isolating layer is fully covering the counter electrode and the short prevention layer.

10. The method according to claim 7, wherein the electrically isolating layer is deposited by spray coating or by screen printing or tampon printing.

11. The method according to claim 10, further comprising the step of curing the electrically isolating layer after deposition via exposure of the deposited electrically isolating layer to at least one of ultra violet light or enhanced temperature.

12. The organic electroluminescent device according to claim 1, wherein the thickness of the short prevention layer is more than 20 nm.

13. The organic electroluminescent device according to claim 1, wherein the counter electrode has a layer thickness that is between 10 and 100 nm.

14. The organic electroluminescent device according to claim 1, wherein the electrically isolating layer has a layer thickness of more than 5 micrometers.

* * * * *